United States Patent
Garcia et al.

[19]

[11] Patent Number: 6,123,286
[45] Date of Patent: Sep. 26, 2000

[54] APPARATUS FOR WINDING A CARRIER TAPE

[75] Inventors: Marcos Varela Garcia; Jesus Angel Garcia de la Cruz; Gilberto Jaime Martinez Becerra, all of Nuevo Leon, Mexico

[73] Assignee: Kemet Corporation, Greenville, S.C.

[21] Appl. No.: 09/212,435

[22] Filed: Dec. 16, 1998

[51] Int. Cl.⁷ ................................................. B65H 19/28
[52] U.S. Cl. .................................. 242/587.2; 242/587.3; 242/532.6; 242/160.4
[58] Field of Search ............................. 242/587.2, 587.3, 242/532.6, 160.4; 206/384, 411, 415, 414, 714

[56] References Cited

U.S. PATENT DOCUMENTS

| | | |
|---|---|---|
| 2,151,536 | 3/1939 | Sperry . |
| 3,208,684 | 9/1965 | Ramstein . |
| 3,241,783 | 3/1966 | Laa . |
| 3,423,982 | 1/1969 | Sackl . |
| 3,604,651 | 9/1971 | Ohno . |
| 3,910,512 | 10/1975 | Jureit et al. . |
| 4,747,553 | 5/1988 | Ogawa . |
| 5,054,710 | 10/1991 | Ikariya et al. . |
| 5,136,827 | 8/1992 | Sawaya . |
| 5,360,110 | 11/1994 | Hirai et al. . |
| 5,494,168 | 2/1996 | Hart ................................. 242/587.2 X |
| 5,499,781 | 3/1996 | Reinke . |

*Primary Examiner*—Donald P. Walsh
*Assistant Examiner*—William A. Rivera
*Attorney, Agent, or Firm*—Banner & Witcoff, Ltd.

[57] ABSTRACT

An apparatus for feeding an electronic component to an insertion device using a carrier tape according to the present invention includes a hub having first and second lateral sides and a peripheral surface extending between the lateral sides. The apparatus also includes a tape receiving slot extending into the hub. The slot includes a first laterally extending portion having a first height and a second laterally extending portion having a second height. The height of the second laterally extending portion is smaller than that of the first laterally extending portion for aiding in the proper orientation of the carrier tape within the slot so the electronic components can be properly delivered to the insertion device. The height of the second portion is also smaller than the height of the component receiving compartments. The reel allows the tape to be wound in only one direction so it is not unreeled backwards and the components are not applied to an electronic circuit board in a reverse or wrong manner. The reel also reduces circuit board and machinery failure by preventing the improper insertion of electronic components through proper component presentation to the insertion machine.

36 Claims, 8 Drawing Sheets

APPARATUS FOR WINDING A CARRIER TAPE

FIELD OF THE INVENTION

The present invention relates to a reel for winding a tape, more particularly, a reel for winding a tape carrying electronic components so as the tape is unrolled, the electronic components feed properly for placement within a circuit board.

BACKGROUND OF THE INVENTION

Electronic component insertion machines receive component carrying tapes and position the contained components on circuit boards. The carrier tape typically feeds into the insertion machine in a predetermined manner. The component carrier tape includes a storage tape having individual compartments proximate one lateral side for housing the electronic components and a cover tape extending over the openings of the individual compartments for maintaining the components within the tape. The carrier tape also includes advancement holes along the other lateral side for mating with the advancement mechanism of the feeding machine that unwinds the tape. In order for the component to be properly positioned on the circuit board, the component must be correctly oriented as it feeds into the insertion machine. Correctly positioning the tape on the reel is critical. If the tape is not fed in the proper orientation, the component can be installed in the circuit board in a reverse or wrong manner. Improper installation can result in the failure of the circuit board and possibly the failure of the machine in which the circuit board is installed.

Existing reels for winding tape include a hub about which the carrier tape is wound and an end plate positioned on either side of the hub. The end plates typically extend beyond the outer diameter of the hub to provide lateral support to the tape and prevent it from sliding off the reel. The reel hubs used with existing carrier tape winding machines include a tape receiving slot into which a first end of the carrier tape is inserted. These hubs include a "lead in" or opening at the point where the slot meets a peripheral surface of the hub. The carrier tape is wound over one of the edges of the lead in for frictionally retaining it within the slot. Typically, the tape receiving slots of existing reels include a constant rectangular cross section. An example of a reel having such a slot is shown in U.S. Pat. No. 4,747,553 to Ogawa. Slots having constant rectangular cross sections allow the tape to be inserted in any orientation and fed over either edge of the lead in as long as the machine engaging holes of the tape mate with the advancing mechanism of the feeding machine. The lack of a required tape orientation within the slot and a specific edge over which the tape must be reeled can result in the components being incorrectly oriented within the slot, the tape being reeled backwards on the hub and the carried components being incorrectly positioned on the circuit board. The frequency of these errors increases as the speed at which the reel operator has to work increases. If the carrier tape is not positioned on the reel so that the components are delivered to the insertion machine in their proper orientation or if the feeding portion of the tape can not engage the advancing mechanism, the customer will have to return the tape or be forced to re-reel it themselves. This can be very time consuming and aggravating. This is especially true with polar components. When polar components are improperly fed to the insertion machine and incorrectly installed on a circuit board, they can cause the circuit board and the device carrying the board to fail.

It is an object of the present invention to overcome the problems associated with existing reels for winding carrier tapes. It is also an object of the present invention to provide a reel having a tape receiving slot that prevents a component carrying tape from being improperly oriented on the reel and incorrectly wound about the reel hub.

SUMMARY OF THE INVENTION

The operator of a carrier tape reeling device must ensure that the tape is properly oriented within the tape receiving slot of the reel and wound on the reel hub in the correct direction. The present invention relates to an error proof reel for winding and unwinding a carrier tape. The tape reel only receives a carrier tape when it is properly oriented with respect to a tape receiving slot in the reel hub. The reel hub only allows the tape to be reeled over one slot edge and in one direction so the contained electronic components will be properly oriented when the tape is fed to an insertion machine. This is especially important for tapes carrying electronic components, such as capacitors, that must feed in the proper direction to ensure proper installation in a circuit board and to keep the insertion machine feeding properly. As with the tape used in the prior art, the carrier tape used with the present invention reel includes component receiving compartments spaced along one lateral side for holding the components. The compartments are covered by a thin tape or film so the components are not separated from the carrier tape before being fed to the insertion machine. The carrier tape also includes advancement holes along the other lateral side for mating with the advancement mechanism of the machine that unwinds the tape so the components can be inserted into a circuit board or other component carrier. The interior of the reel hub slot according to the present invention is contoured to form tape receiving areas that only allow the tape to be inserted one-way. When the tape is attempted to be inserted the wrong way, it will not fit in the slot and, for example, the side of the tape having the advancing holes will be forced outside the sides of the reel.

An apparatus for feeding an electronic component to an insertion device using a carrier tape according to the present invention includes a hub having first and second lateral sides and a peripheral surface extending between the lateral sides. The apparatus also includes a tape receiving slot extending into the hub. The slot includes a first laterally extending portion having a first height and a second laterally extending portion having a second height. The height of the second laterally extending portion is smaller than that of the first laterally extending portion for aiding in the proper orientation of the carrier tape within the slot so the electronic components can be properly delivered to the insertion device. The height of the second portion is also smaller than the height of the component receiving compartments.

The apparatus according to the present invention also comprises a reel having a hub including first and second lateral sides and a peripheral surface extending between the lateral sides. A tape receiving slot extends into the hub and includes a width extending along the peripheral surface of the hub between its lateral sides and a length extending perpendicular to the width. The slot also includes an upper surface forming a first angle with a first plane at an upper peripheral edge of the slot. The first plane extends along the peripheral surface of the hub at a point of tangency with the upper edge. The upper peripheral edge of the slot is capable of restricting the movement of the carrier tape. The slot further includes a first lower surface extending along it and a second lower surface extending between the first lower surface and the peripheral surface. The second lower surface forms a lower peripheral edge with the peripheral surface of the hub such that an angle is formed between a first end of the second lower surface and a plane extending along the peripheral surface of the hub at a point of tangency with the lower edge. An angle is also formed between a second end of the second lower surface and a plane extending away from the hub and parallel to the length of the slot. The magnitude of the second and third angles prevents the carrier tape from being reeled over the lower edge.

The reel according to the present invention allows the tape to be wound in only one direction so it is not unreeled backwards and the components are not applied to an electronic circuit board in a reverse or wrong manner. The present invention reduces circuit board and machinery failure by preventing the improper insertion of electronic components through proper component presentation to the insertion machine.

DETAILED DESCRIPTION OF THE PREFERRED EMBODIMENT

Figure 1:
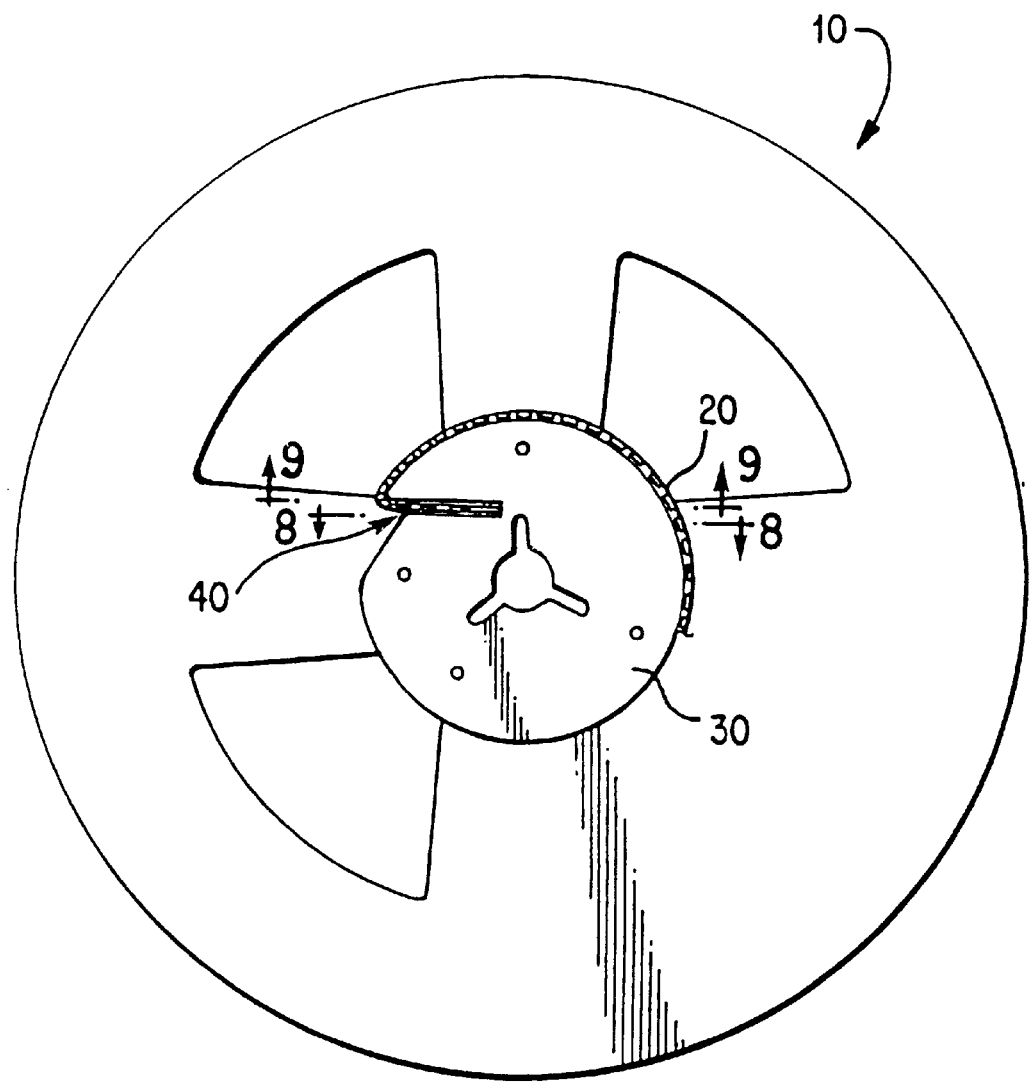
FIG. 1 is a side elevational view of a reel according to the present invention having a carrier tape wound partially around it with one of the end plates removed.

The present invention relates to a reel 10 that receives an electronic component carrier tape 20 in only a single orientation and winds the tape in only one direction to ensure that the carried components are delivered to an insertion machine in the proper orientation. As is known in the prior art, one side 21 of carrier tape 20 includes a plurality of component receiving compartments 22 for receiving and holding electronic components such as capacitors. The other side of tape 20 includes a feeding portion 25 having a plurality of evenly spaced holes 24 that engage an advancement mechanism, such as a sprocket, of an insertion machine for holding and unwinding the tape 20. A thin, cover tape 23, similar to a film, is positioned over compartments 22 to prevent the electronic components from being prematurely removed. Tape 20 is typically formed of a polycarbonate with a MYLAR® covering tape.

Figure 3:
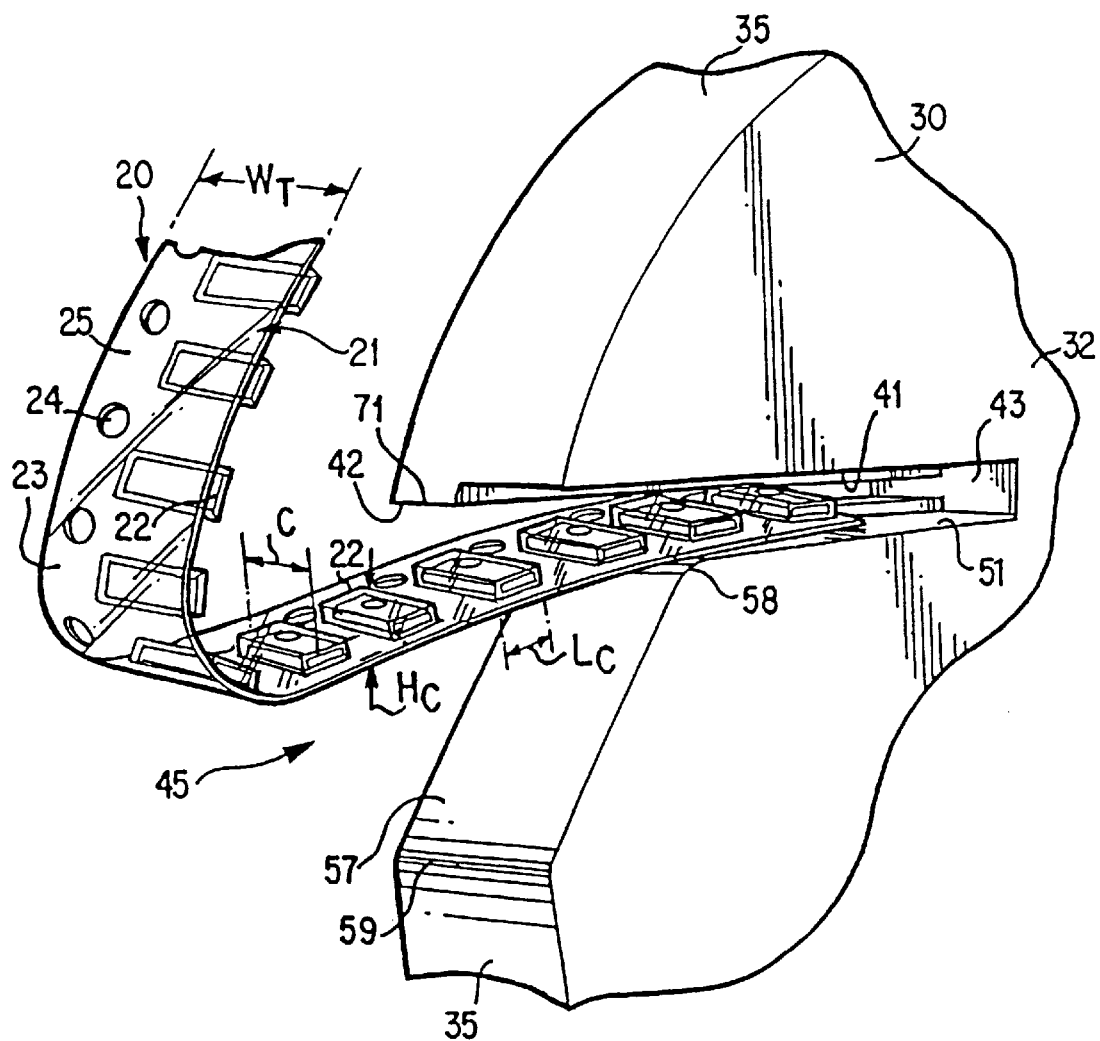
FIG. 3 illustrates a component carrier tape positioned within the slot shown in FIG. 2.
Figure 4:
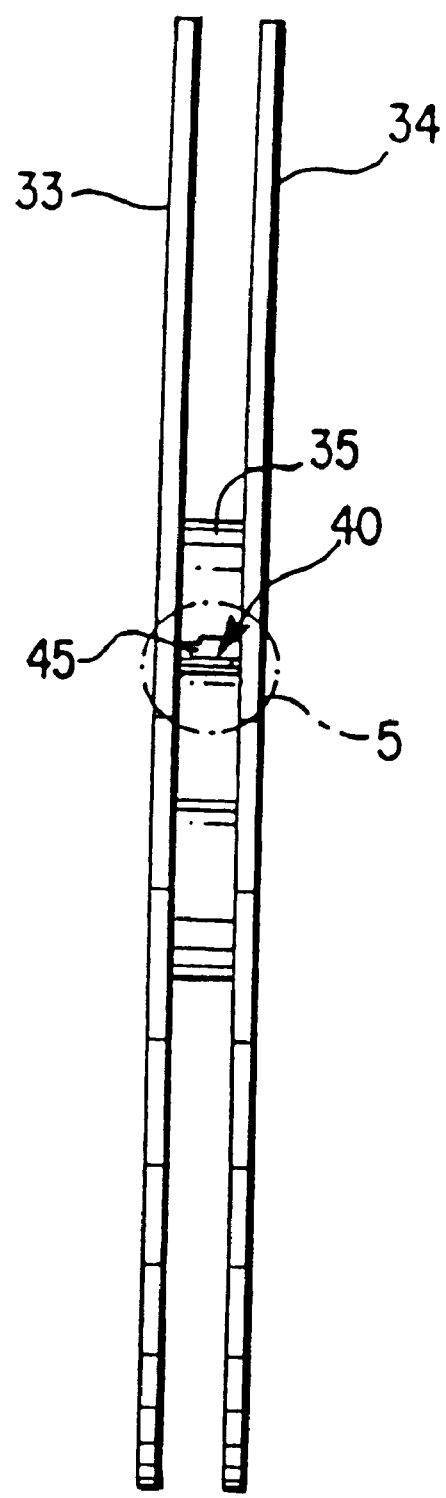
FIG. 4 is a side elevational view of the reel shown in FIG. 1.
Figure 5:
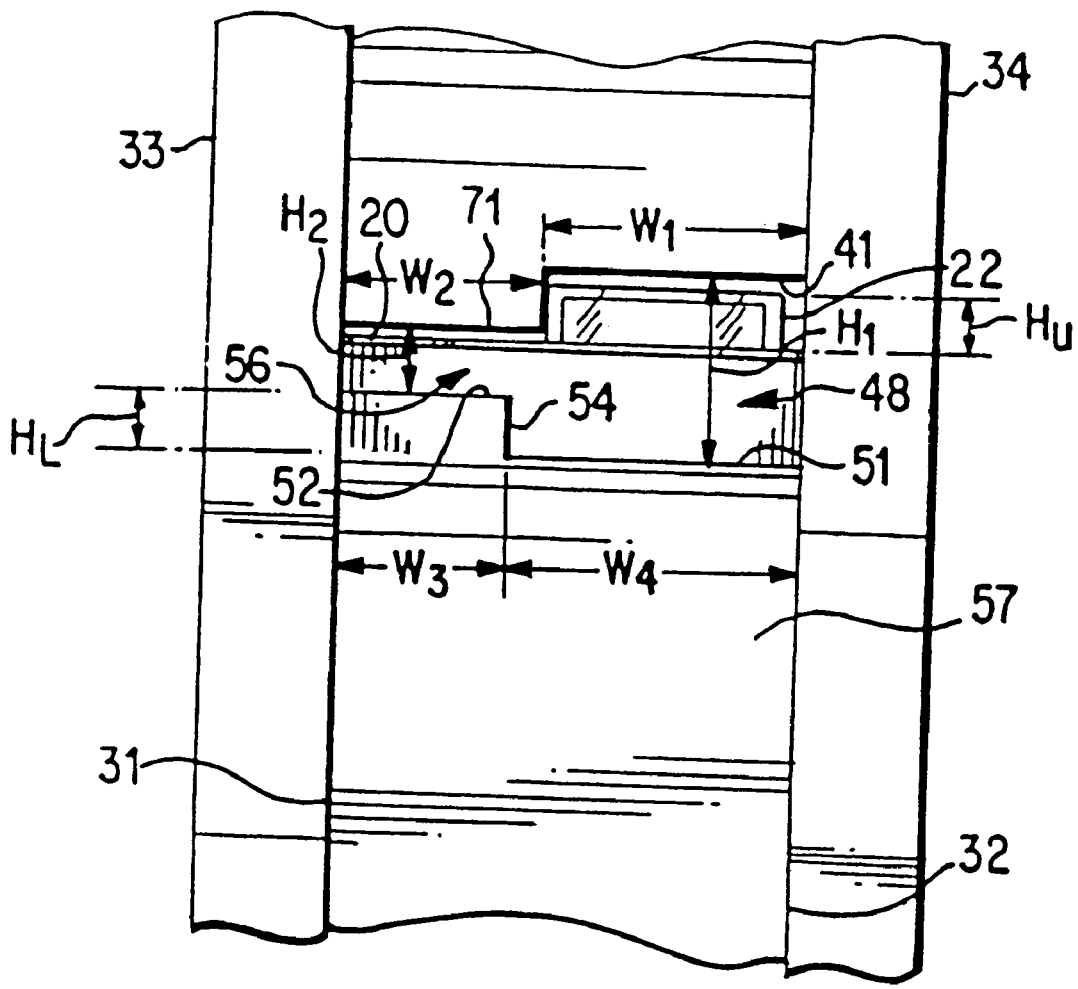
FIG. 5 is an enlarged view of the region 5 of FIG. 4.

The reel 10 includes a hub 30 having a tape receiving slot 40 extending within hub 30. As shown in FIGS. 3 and 5, the slot 40 includes a first laterally extending tape receiving space 48 having a height $H_1$ and a second laterally extending tape receiving space 56 having a height $H_2$. Height $H_1$ is sized to receive the component receiving compartments 22. $H_2$ is sized smaller than $H_1$ and the height $H_C$ of component receiving compartments 22 so that compartments 22 will not fit within tape receiving space 56 and instead will only fit within space 48. The height $H_2$ of space 56 is sized to receive the feeding portion 25 of tape 20. As discussed below, spaces 48 and 56 and the edges of slot 40 properly position the carrier tape 20 within the slot 40 and on the reel 10 so the carried components are properly oriented with respect to a circuit board on which they will be inserted.

Reel 10 includes slot 40 for receiving carrier tape 20. In order to ensure proper component positioning during insertion, the component carrying portion 22 and advancing holes 24 must be properly located within slot 40. This is accomplished by properly orienting the component carrying portions 22 with respect to the surfaces of slot 40 and properly winding tape 20 about hub 30. Carrier tape 20 can only fit within slot 40 when tape 20 is properly oriented as shown in FIG. 3. Tape 20 will not completely fit within slot 40 and can not be wound on hub 30 when incorrectly positioned.

Hub 30 includes first and second lateral sides 31, 32 and an inner bearing surface 37 for receiving the axle of a winding machine. End plates 33, 34, also referred to as flanges, are each secured to a respective one of the sides 31, 32 and extend above a peripheral surface 35 of hub 30 for preventing the wound carrier tape 20 from sliding off hub 30. End plates 33, 34 are secured to hub 30 in a well known manner such as by using removable fasteners or being integrally molded with its sides 31, 32. The "lead in" or opening 45 of slot 40 is formed in a peripheral surface 35 extending between sides 31, 32.

Slot 40 includes a first upper surface 41 and a second upper surface 42 spaced by a vertical sidewall 44 forming a step that vertically connects surface 41 to surface 42. Surfaces 41 and 42 extend between a rear wall 43 of slot 40 and peripheral surface 35. First upper surface 41 extends inwardly from the peripheral surface 35 to the rear wall 43 in the direction of the center of hub 30 along the length of slot 40. Second upper surface 42 also extends inwardly toward the center of hub 30 from peripheral surface 35 to the rear wall 43.

Figure 2:
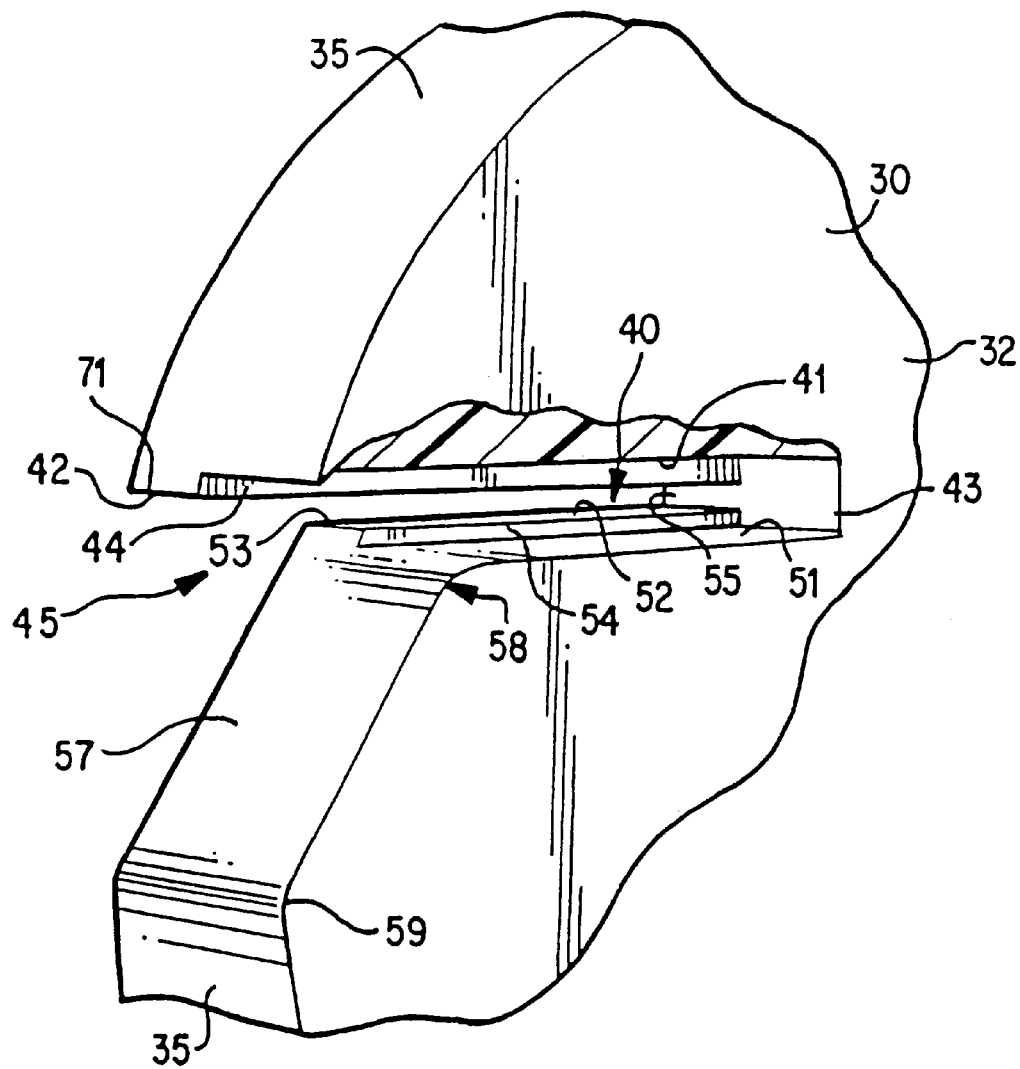
FIG. 2 illustrates the tape receiving slot of the hub of the reel shown in FIG. 1 partially in section.
Figure 6:
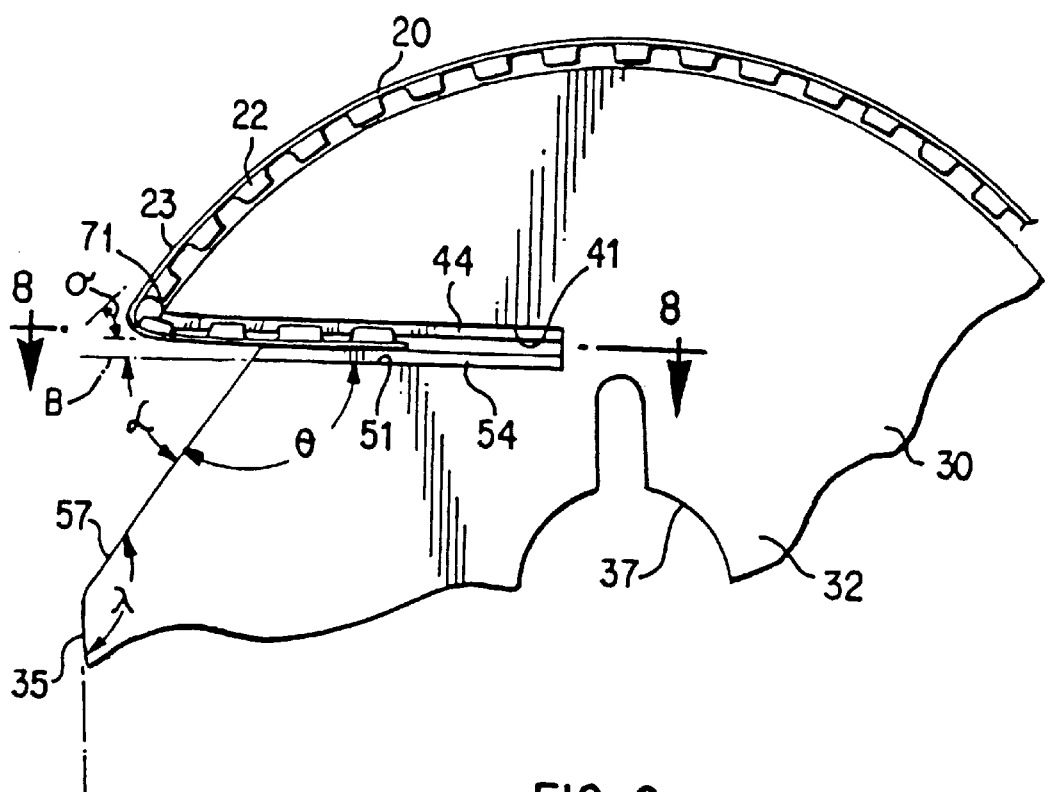
FIG. 6 is a partial side elevational view of one side of the reel showing a carrier tape positioned within the tape receiving slot and partially wound about the reel hub.
Figure 7:
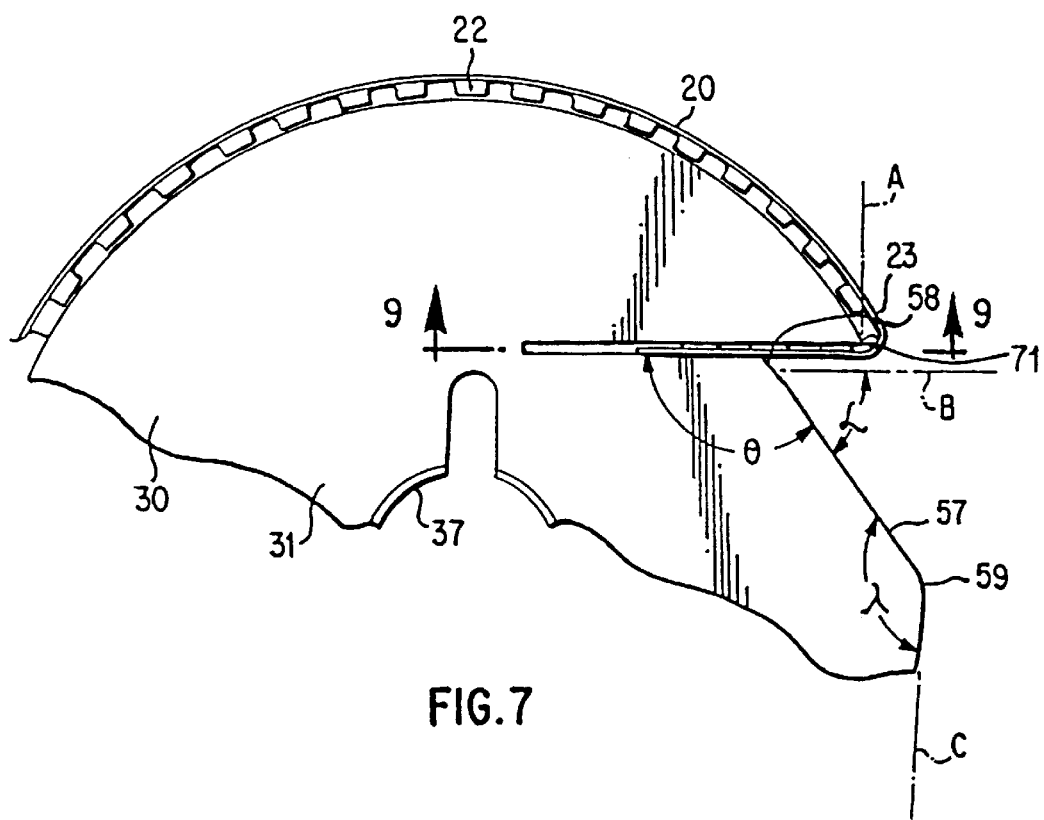
FIG. 7 is a partial side elevational view of the other side of the reel showing a carrier tape positioned within the tape receiving slot and partially wound about the reel hub.
Figure 8:
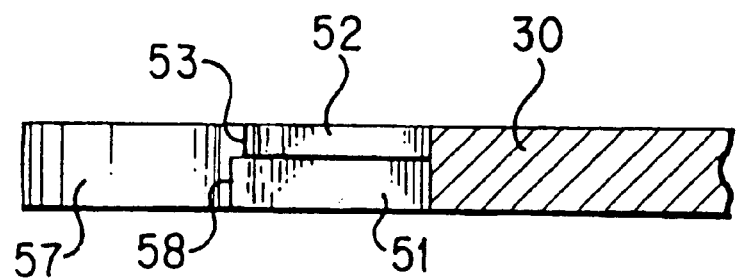
FIG. 8 is a partial cross sectional view of the reel hub taken along line 8—8 of FIG. 1.
Figure 9:
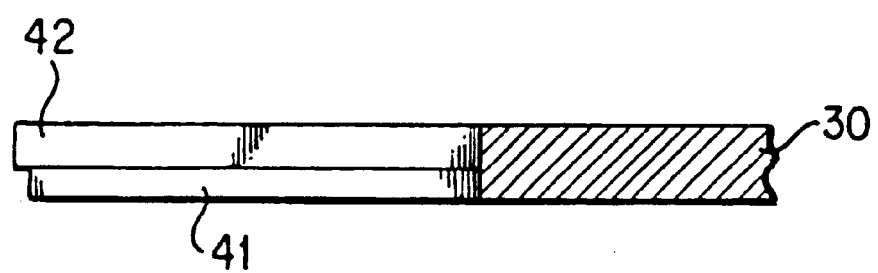
FIG. 9 is a partial cross sectional view of the reel hub taken along line 9—9 of FIG. 1.

Slot 40 also includes a first lower surface 51 and a second lower surface 52 extending parallel to surfaces 41 and 42. First lower surface 51 extends between the rear wall 43 and a first edge 58 of a sloped, third lower surface 57. Third lower surface 57 extends from edge 58 to peripheral surface 35 at an angle relative to first lower surface 51. Second lower surface 52 stretches between rear wall 43 and a second edge 53 of sloped surface 57, as shown in FIG. 2. Lower surfaces 51 and 52 are connected by a sidewall 54 that vertically spaces them apart. Sidewall 54 has a height extending away from lower surface 51 in the direction of upper surface 41. As seen in FIGS. 2 and 6, surfaces 41 and 51 are parallel and at least partially coextensive with each other along the length and width of slot 40. Second surfaces 42 and 52 are also parallel and partially coextensive with each other.

The first tape receiving space 48 formed by the co-extending portions of first upper surface 41 and first lower surface 51 receives component compartments 22 of tape 20. Tape receiving space 48 has a height $H_1$ that is larger than the height $H_C$ of the component receiving compartments 22 so the compartments can be received within space 48. The second tape receiving space 56, between co-extensive portions of second upper surface 42 and second lower surface 52, receives the feeding portion 25 of tape 20 including advancing holes 24. Second tape receiving space 56 has a height of $H_2$ that is smaller than $H_1$ and $H_C$. The tape receiving spaces 48, 56 and their surfaces ensure the proper position and orientation of the component carriers 22 and advancing holes 24. Second space 56 is sized so component carrying compartments 22 will not fit between surfaces 42 and 52. The height $H_2$ of space 56 is such that it is large enough to receive feeding portion 25 of tape 20, but not large enough to receive a component compartment 22. This ensures that compartments 22 will only be positioned in receiving space 48. The tape receiving spaces 48, 56 prevent an operator from incorrectly positioning the tape 20 within hub 30.

Component compartments 22 must also be properly oriented within space 48. Proper orientation includes positioning the component compartments 22 in space 48 with cover tape 31 proximate the lower surface 51. This causes the tape feeding portion 25 to be located in space 56. Tape 20 cannot be inserted in slot 40 when the compartments 22 are aligned with space 48 and the cover tape 23 is not proximate lower surface 51 because this means that feeding portion 25 will not be aligned with space 56. When component carrying compartments 22 are aligned with space 48 and feeding portion 25 is not aligned with space 56, feeding portion 25 will be on the opposite side of reel 30 from space 56 and contact a surface of the end plate 33 or 34 proximate space 48. This creates a physical sign for the operator attempting to insert the tape. The operator will know to turn the tape 20 over so that the cover tape 23 is proximate lower surface 51 and advancement holes 24 of feeding portion 25 are positioned in space 56. The tape 20 is properly positioned when the component compartments 22 are located in space 48, advancement holes 24 are located in space 56 and the cover tape faces lower surface 51. When this occurs, the tape 20 will be positioned so the components are delivered to the insertion machine in the correct position.

Reel hub 40 is designed so tape 20 will reel over edge 71 of slot 40. This ensures that the tape is always reeled in the proper direction and correctly unreeled by the feeder for the component insertion machine. Tape 20 will slide out of slot 40 if improper winding of the tape 20 is attempted, e.g., winding about edge 58. An angle $\alpha$ of between 50 and 60 degrees is formed between a plane B extending away from lower surfaces 51 and 52 parallel to the length of slot 40 and sloping lower surface 57. Angle $\alpha$ is preferably 56 degrees. As a result, the angle $\theta$ between lower surfaces 51 and 52 and slanted surface 57 is in the range of 120 to 130 degrees, preferably 124 degrees. As shown in FIG. 6, the obtuse angle $\theta$ and the obtuse angle $\lambda$, between surface 57 and a plane C extending tangent to peripheral surface 35 and away from slot 40, do not provide enough friction to hold tape 20 when reeled in the wrong direction, over edges 58 and 59. Angle $\lambda$ has essentially the same magnitude as angle $\theta$. Edge 59 is formed between surface 57 and peripheral surface 35 at the end of surface 57 opposite first edge 58.

Upper surfaces 41, 42 extend essentially parallel to surfaces 51, 52 and substantially perpendicular to a plane A. Plane A is tangent with peripheral surface 35 at an edge 71. Edge 71 is formed at the point where surface 35 meets the forward, terminal end of surface 41 at the lead in 45 of slot 40. Tape 20 is wrapped about the substantially right angle $\phi$ formed at edge 71 with a component carrying compartment 22 being positioned on either side of the edge 71. The angle $\phi$ is preferably between 85 and 95 degrees with a preferred angle being substantially 90 degrees. Angle $\phi$ and the acute angle $\sigma$ at which the peripheral surface extends away from edge 71 create enough friction to maintain the position of tape 20 within slot 40 so it can be wound about hub 30. Edge 71 essentially acts as a cleat for preventing the unwanted movement of tape 20 within slot 40 during reeling.

As discussed above and as shown in FIG. 5, first upper surface 41 and first lower surface 51 are parallel with each other along the width of slot 40, between sides 31, 32. However, it is contemplated that these surfaces may only be partially parallel along the width of slot 40. The distance $W_1$ that first upper surface 41 extends along the width of hub 30 is almost twice the distance $W_2$ that second upper surface 42 extends along peripheral surface 35 between side 31 of hub 30 and sidewall 44. The first lower surface 51 extends a distance $W_3$ along the width of slot 40. Second lower surface 52 extends a distance $W_4$ between lower sidewall 54 and side 31.

The dimensions of the reel hub 30 and slot 40 will differ depending on the size of the tape being reeled. As an example, for a carrier tape having a width $W_T$ of 0.315 inch with component receiving compartments 22 having a width $W_C$ of 0.132 inch, a length $L_C$ of 0.071 inch and a height (including the height of the thickness of tape 20) $H_C$ of 0.055 inch, the slot 40 of reel 10 would have an overall width at the lead in 45 of 0.32 to 0.35 inch, with a preferred width being 0.32 inch. For such a reel, the width $W_1$ of first upper surface 41 would be between 0.15 and 0.25 inch, preferably about 0.21 inch, and the width $W_2$ of second upper surface 42 would be about 0.075 to 0.125 inch, preferably about 0.110 inch. Lower surface 51 would have a width $W_3$ between 0.20 and 0.25 inch, with a preferred width being about 0.236 inch. The width $W_4$ of second lower surface 52 would extend between lower sidewall 54 and lateral side 31 a distance of between 0.05 and 0.1 inch. A preferred width for surface 52 would be substantially 0.084 inch.

Slot 40 would have an overall height equal to that of the height $H_1$ of tape receiving space 48. $H_1$ would be substantially between 0.085 and 0.115 inch, with a preferred height being 0.10 inch. The height $H_2$ of tape receiving space 56 would be between 0.03 and 0.04 inch, with a preferred height being substantially 0.035 inch for receiving the feeding portion 25 of tape 20. Sidewall 44 would have a height $H_U$ extending away from upper surface 41 of substantially 0.03 to 0.04 inch, with a preferred height being substantially 0.035 inch. Sidewall 54 would have a height $H_L$ of substantially 0.025 to 0.035 inch, with a preferred height being substantially 0.030 inch. Therefore, sidewalls 44 and 54 would be separated by a space of about 0.03 to 0.04 inch, with a preferred distance being substantially 0.035 inch.

The distance slot 40 extends within hub 30 can depend on the amount of tape that needs to be positioned within slot 40 so that it stays on the reel 10 during the winding of tape 20. For the above sized tape, first upper surface 41 would extend inwardly from peripheral surface 35 between 0.8 and 1.0 inch, preferably about 0.925 inch, along the length of slot 40. Second upper surface 42 would extend inwardly along the length of slot 40 between 0.85 inch and 1.2 inch, with a preferred distance being substantially 1.0 inch. Lower surface 51 would extend parallel to surface 51 a distance of between 0.6 inch and 0.85 inch, with a preferred distance being substantially 0.715 inch. The length of second lower surface 52 would be between 0.5 and 0.7 inch, with a preferred distance being about 0.625 inch.

The dimensions discussed above could be varied to accommodate numerous types and sizes of tapes. The dimensions could be increased as the width of the tape and size of the component carrying compartments increase. For example, the size of the hub and slot could be increased to receive a tape carrying electronic components other than capacitors. Also, materials other than those discussed above can be used for the tape, hub and other components of the reel. Many possible embodiments of the invention may be made without departing from the scope thereof which is defined by the appended claims. It is to be understood that all the matter set forth herein or shown in the drawings is illustrative and not limiting to the present invention. It will be understood that certain features and subcombinations have utility and may be employed without reference to other features or subcombinations.

What is claimed is:

1. An apparatus for feeding an electronic component to an insertion device using a carrier tape, said apparatus comprising:
    a) a hub having first and second lateral sides and a peripheral surface extending between said lateral sides; and
    b) a tape receiving slot extending into said hub, said slot including:
        i) a first laterally extending space having a first height; and
        ii) a second laterally extending space having a second height smaller than said first height for aiding in the proper orientation of the carrier tape within the slot so the electronic component can be properly delivered to the insertion device.

2. The apparatus according to claim 1 wherein said tape receiving slot has a length extending into said hub and a width extending along said peripheral surface between said lateral sides.

3. The apparatus according to claim 1 wherein said first laterally extending space includes a first upper surface and a first lower surface; and said second laterally extending space includes a second upper surface and a second lower surface.

4. The apparatus according to claim 3 wherein said first and second upper surfaces are vertically displaced from one another.

5. The apparatus according to claim 4 wherein said first and second lower surfaces are vertically displaced from one another.

6. The apparatus according to claim 5 wherein said first and second upper surfaces are vertically displaced by an upper sidewall; and said first and second lower surfaces are vertically displaced by a lower sidewall.

7. The apparatus according to claim 3 wherein at least a portion of said first upper surface and at least a portion of said first lower surface extend substantially parallel to one another.

8. The apparatus according to claim 3 wherein at least a portion of said second upper surface and at least a portion of said second lower surface extend substantially parallel to one another.

9. The apparatus according to claim 3 wherein at least one of said first and second upper surfaces forms an upper terminal edge with said peripheral surface of said hub over which said carrier tape can be reeled.

10. The apparatus according to claim 9 wherein said at least one of said first and second upper surfaces extends between a rear wall of said tape receiving slot and said upper terminal edge.

11. The apparatus according to claim 10 wherein said at least one of said upper surfaces extends substantially perpendicular to a plane extending along said peripheral surface of said hub at the point of tangency with said upper edge so that the carrier tape will be retained within said slot when reeled over said upper terminal edge.

12. The apparatus according to claim 11 wherein said at least one of said first and second upper surfaces forms an angle with said plane extending along said peripheral surface at said upper edge; and wherein said angle is 90 degrees or less.

13. The apparatus according to claim 12 wherein said slot includes a third lower surface extending between said lower surfaces and a lower terminal edge.

14. The apparatus according to claim 13 wherein said lower surfaces extend between said rear wall of said tape receiving slot and said third lower surface; and wherein said third lower surface forms an acute angle with a plane extending away from said hub and substantially parallel to the length of said slot.

15. The apparatus according to claim 14 wherein said third lower surface extends at an acute angle relative to a plane extending along said peripheral surface of said hub at a point of tangency with said lower edge.

16. A carrier tape and an apparatus for unwinding the carrier tape and feeding at least one electronic component to an insertion device,
    said carrier tape comprising a plurality of component receiving compartments;
    said apparatus comprising:
        a) a hub having first and second lateral sides and a peripheral surface extending between said lateral sides; and
        b) a tape receiving slot extending into said hub from said peripheral surface, said slot including:
            i) a first laterally extending space having a first height; and
            ii) a second laterally extending space having a second height smaller than said first height for aiding in the proper orientation of the carrier tape within the slot so the electronic component can be properly delivered to the insertion device.

17. The apparatus according to claim 16 wherein the height of said first lateral space is greater than the height of one of said component receiving compartments.

18. The apparatus according to claim 17 wherein the height of one of said component receiving compartments is greater than the height of said second lateral space so that said component receiving compartments are only received within said first lateral space.

19. An apparatus for feeding and reeling electronic components, said apparatus comprising:
    a) a reel having a hub including first and second lateral sides and a peripheral surface extending between said lateral sides; and
    b) a tape receiving slot extending into said hub, said tape receiving slot having a width extending along said peripheral surface between said lateral sides and a length extending perpendicular to said width, said tape slot including:
        i) an upper surface forming a first angle with a first plane at an upper edge of said slot, said first plane extending along said peripheral surface of said hub at a point of tangency with said upper edge, said upper edge being capable of restricting the movement of the carrier tape;
        ii) a first lower surface extending along said slot; and
        iii) a second lower surface extending between said first lower surface and said peripheral surface, said second lower surface forming a lower edge with said peripheral surface;
    wherein a second angle is formed between a first end of said second lower surface and a plane extending along said peripheral surface of said hub at a point of tangency with said lower edge and a third angle is formed between a second end of said second lower surface and a plane extending away from said hub and parallel to the length of said slot, whereby said second and third angles prevent the carrier tape from being reeled over said lower edge.

20. The apparatus according to claim 19 wherein said first angle includes a magnitude of 90 degrees or less; and said second angle includes a magnitude of less than 90 degrees.

21. The apparatus according to claim 19 further including a second upper surface; and wherein said first and second upper surfaces are spaced by a substantially vertical sidewall.

22. The apparatus according to claim 21 further including a third lower surface, at least a portion of said third lower surface extending parallel to said first lower surface.

23. The apparatus according to claim 22 further including a carrier tape having a plurality of component receiving compartments, each said compartment having a height.

24. The apparatus according to claim 23 wherein said first upper surface and said first lower surface define a first space within said slot for receiving said component receiving compartments of said carrier tape, said first space having a height extending between said first upper surface and said first lower surface that is greater than said height of said component receiving compartments.

25. The apparatus according to claim 24 wherein a second space is defined by said second upper surface and said third lower surface for receiving a non-component carrying portion of the carrier tape, said second space having a height extending between said second upper surface and said third lower surface that is smaller than said height of said component receiving compartment.

26. An apparatus for reeling and feeding components, said apparatus comprising:
a reel having a hub including first and second lateral side surfaces and a peripheral surface extending therebetween along a width of said hub, said hub including a slot for receiving and properly orienting a carrier tape on the reel, said slot comprising:
i) first and second upper surfaces spaced by a substantially vertically extending sidewall for guiding and positioning the carrier tape within the slot;
ii) a first lower surface; and
iii) said first upper surface being vertically spaced from said first lower surface by a first distance, said second upper surface being vertically spaced from said first lower surface by a second distance, wherein said first distance is greater than said second distance.

27. The reel according to claim 26 wherein said slot includes a second lower surface vertically spaced from said first lower surface by a substantially vertical sidewall; and wherein said second lower surface extends substantially parallel to a portion of said second upper surface.

28. The reel according to claim 27 wherein said second upper surface is spaced from said second lower surface a distance that is less than the distance said second upper surface is spaced from said first lower surface.

29. The apparatus according to claim 28 further including a carrier tape having a plurality of component receiving compartments, each said compartment having a height that is greater than the distance between said second upper surface and said second lower surface.

30. The apparatus according to claim 29 wherein said height of said component receiving compartments is less than the distance between said first upper surface and said first lower surface.

31. The apparatus according to claim 30 wherein at least one of said first and second upper surfaces forms an upper terminal edge with said peripheral surface of said hub over which said carrier tape can be reeled.

32. The apparatus according to claim 31 wherein said first and second upper surfaces extend between a rear wall of said slot and said upper terminal edge.

33. The apparatus according to claim 32 wherein said at least one of said upper surfaces extends substantially perpendicular to a plane extending along said peripheral surface of said hub at the point of tangency with said upper terminal edge so that the carrier tape will be retained within said slot when reeled over said upper terminal edge.

34. The apparatus according to claim 33 wherein said at least one of said first and second upper surfaces forms an angle with said plane extending along said peripheral surface at said upper terminal edge; and wherein said angle is 90 degrees or less.

35. The apparatus according to claim 34 wherein said slot includes a third lower surface extending between said first lower surface and a lower terminal edge.

36. The apparatus according to claim 35 wherein said first lower surface extends between a rear wall of said slot and said third lower surface; and wherein said third lower surface forms an acute angle with a plane extending away from said hub and substantially parallel to the length of said slot.

* * * * *